United States Patent
Fujii et al.

(10) Patent No.: US 8,864,288 B2
(45) Date of Patent: Oct. 21, 2014

(54) PIEZOELECTRIC DEVICE, METHOD OF MANUFACTURING PIEZOELECTRIC DEVICE, AND LIQUID EJECTION HEAD

(71) Applicant: FUJIFILM Corporation, Tokyo (JP)

(72) Inventors: Takamichi Fujii, Ashigarakami-gun (JP); Yoshikazu Hishinuma, Santa Clara, CA (US)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/644,239

(22) Filed: Oct. 3, 2012

(65) Prior Publication Data

US 2013/0229465 A1    Sep. 5, 2013

Related U.S. Application Data

(60) Provisional application No. 61/543,057, filed on Oct. 4, 2011.

(51) Int. Cl.
| | | |
|---|---|---|
| B41J 2/045 | (2006.01) | |
| B41J 2/14 | (2006.01) | |
| H01L 41/257 | (2013.01) | |
| H01L 41/29 | (2013.01) | |
| H01L 41/047 | (2006.01) | |
| H01L 41/316 | (2013.01) | |
| H01L 41/053 | (2006.01) | |
| H01L 41/09 | (2006.01) | |
| H01L 41/297 | (2013.01) | |

(52) U.S. Cl.
CPC ......... *H01L 41/0533* (2013.01); *B41J 2/14233* (2013.01); *H01L 41/257* (2013.01); *B41J 2/045* (2013.01); *H01L 41/29* (2013.01); *H01L 41/0471* (2013.01); *H01L 41/0477* (2013.01); *H01L 41/316* (2013.01); *H01L 41/0973* (2013.01); *H01L 41/297* (2013.01)
USPC .......................................................... 347/68

(58) Field of Classification Search
None
See application file for complete search history.

(56) References Cited

U.S. PATENT DOCUMENTS

2009/0066188 A1*    3/2009    Naono et al. ................... 310/330

FOREIGN PATENT DOCUMENTS

| JP | 8-116103 A | 5/1996 |
|---|---|---|
| JP | 9-181368 A | 7/1997 |
| JP | 2001-77438 A | 3/2001 |
| JP | 2009-139338 A | 6/2009 |
| JP | 2009139338 A * | 6/2009 |

* cited by examiner

*Primary Examiner* — Matthew Luu
*Assistant Examiner* — Erica Lin
(74) *Attorney, Agent, or Firm* — Birch, Stewart, Kolasch & Birch, LLP.

(57) ABSTRACT

A piezoelectric device includes: a substrate; a first electrode which is layered over the substrate; a first piezoelectric film which is layered over the first electrode; a metal oxide film which is layered over the first piezoelectric film; a metal film which is layered over the metal oxide film; a second piezoelectric film which is layered over the metal film; and a second electrode which is layered over the second piezoelectric film, wherein a polarizing direction of the first piezoelectric film and a polarizing direction of the second piezoelectric film are different from each other.

21 Claims, 10 Drawing Sheets

44: PNZT FILM (2.0 μm)
40: Ir-O FILM AND Ir FILM (75 nm)
34: PURE PZT FILM (2.0 μm)
32: Ir FILM AND Ti FILM
30: Si SUBSTRATE

FIG.6

| | THICKNESS OF INTERMEDIATE LAYER | PEELING OF UPPER PIEZOELECTRIC BODY | STRESS × THICKNESS |
|---|---|---|---|
| PRACTICAL EXAMPLE A | 50nm | NONE | 25N/m² |
| PRACTICAL EXAMPLE B | 70nm | NONE | 35N/m² |
| PRACTICAL EXAMPLE C | 120nm | NONE | 60N/m² |
| PRACTICAL EXAMPLE D | 150nm | NONE | 75N/m² |
| PRACTICAL EXAMPLE E | 200nm | PARTLY PEELED | 100N/m² |
| COMPARATIVE EXAMPLE | 250nm | PEELED | 125N/m² |

FIG.8

| | FIRST PRACTICAL EXAMPLE | SECOND PRACTICAL EXAMPLE | SECOND COMPARATIVE EXAMPLE |
|---|---|---|---|
| POTENTIAL OF UPPER ELECTRODE (V) | 0 | 0 | −9 |
| SECOND PIEZOELECTRIC FILM | PNZT | PZT | PNZT |
| POLARIZING DIRECTION | ← | → | ← |
| POTENTIAL OF INTERMEDIATE ELECTRODE (V) | +9 | −9 | 0 |
| FIRST PIEZOELECTRIC FILM | PZT | PNZT | PNZT |
| POLARIZING DIRECTION | → | ← | ← |
| POTENTIAL OF LOWER ELECTRODE (V) | 0 | 0 | +9 |
| DISPLACEMENT (nm) | 82 | 81 | 96 |
| DISPLACEMENT / VOLTAGE | 9.1 | 9.0 | 5.3 |

PIEZOELECTRIC DEVICE, METHOD OF MANUFACTURING PIEZOELECTRIC DEVICE, AND LIQUID EJECTION HEAD

BACKGROUND OF THE INVENTION

1. Field of the Invention

The present invention relates to a piezoelectric device and a method of manufacturing the piezoelectric device, and more particularly to a piezoelectric device constituted of piezoelectric films which can be utilized for a variety of purposes such as an actuator, and the like, a manufacturing technique of the same, and a liquid ejection head which uses the same.

2. Description of the Related Art

Japanese Patent Application Publication No. 2009-139338 discloses a structure in which films of piezoelectric material are layered for use of a pressure sensor. The pressure sensor has a laminated structure of electrode layers and the piezoelectric films alternately arranged on a substrate, thereby forming a piezoelectric film laminated body constituted of two or more of piezoelectric films. The electrodes are composed of material such as platinum (Pt), aluminum (Al), molybdenum (Mo), titanium nitride (TiN), ruthenium (Ru), or the like (paragraph 0034 in JP-2009-139338), and each piezoelectric film is formed by a sputtering method (paragraph 0077 in JP-2009-139338).

Japanese Patent Application Publication No. 08-116103 discloses a piezoelectric actuator of a bimorph structure in which electrodes are composed of platinum or palladium. The piezoelectric actuator has a laminated structure in which a first film of piezoelectric material (lead zirconate titanate (PZT)) is layered on a platinum electrode functioning as an external electrode, another platinum electrode functioning as an internal electrode is layered on the first PZT film, and a second PZT film and an external electrode of platinum are layered thereon (paragraph 0018 and FIG. 3 in JP-08-116103).

Japanese Patent Application Publication No. 09-181368 discloses an actuator device having a laminated structure which is manufactured by alternately layering piezoelectric bodies and conductive bodies by means of a film formation technique such as a sputtering method or the like, and also discloses a wiring method of the same. In Japanese Patent Application Publication No. 09-181368, general materials are described with regard to the material of the piezoelectric bodies and the material of the electrodes (platinum, aluminum, gold or silver).

Japanese Patent Application Publication No. 2001-077438 discloses a piezoelectric device having a pair of electrodes and a piezoelectric body arranged therebetween, wherein the piezoelectric body is constituted of first and second piezoelectric films, of which polarizing directions are reversed to each other. The first and second piezoelectric films are continuously formed while differentiating a substrate temperature. By changing the composition along the thickness direction of the piezoelectric body, a thin film bimorph structure is realized.

SUMMARY OF THE INVENTION

As described above, there have been known the laminated structures in which the piezoelectric films are layered by the sputtering method, and the electrodes and the piezoelectric films are alternately formed in layers. However, if piezoelectric films are layered while using the general electrode materials and piezoelectric materials in accordance with the related art, there have been problems that the electrodes peel off and the piezoelectric films also peel off, and it has been actually difficult to form the above-described laminated structure constituted of the piezoelectric films.

For example, in the case where the platinum or palladium electrode is arranged as the intermediate layer (the internal electrode), as in JP-08-116103, it is likely that the piezoelectric film peels or cracks, at a time of forming the piezoelectric film.

As the other specific examples, in a formation of the piezoelectric film by means of a vapor phase epitaxy in which a substrate temperature is set to not lower than 350° C. and not higher than 650° C. (the substrate temperature is a temperature at which the piezoelectric material is crystal grown directly in the vapor phase epitaxy), if an electrode of Pt, iridium (Ir) or the like is formed under a normal condition after forming the piezoelectric film, and another piezoelectric film is thereafter formed on the electrode, there has been a problem that the electrode peels off and the piezoelectric film also peels off.

Further, even in the case that the peeling or the like mentioned above is not generated, an adhesion of the film after the film formation is not good, and the durability as the device has a problem. Even if an adhesion layer of titanium (Ti) or the like is used in order to improve the adhesion, there has been a problem that the piezoelectric film actually peels off.

In the structure disclosed in Japanese Patent Application Publication No. 2001-077438, any intermediate electrode does not exist in the inner portion of the piezoelectric body (between the first and second piezoelectric films) Japanese Patent Application Publication No. 2001-077438 describes that the electrode film of the general electrode material, such as Pt, Au, Pd, Ag, or the like, can be formed between the first and second piezoelectric films; however, does not refer to the problem of the peeling mentioned above and the problem in the durability due to the reduction of the adhesion.

Further, in the case where the piezoelectric device is utilized as an actuator or the like, in addition to the problems mentioned above, it is desirable to obtain a great displacement by applying a drive voltage as low as possible in the light of a reduction of a burden of a drive circuit (a driver).

In this regard, Japanese Patent Application Publication No. 2001-077438 does not have any description relating to a driving method and a drive voltage application method, and does not indicate a viewpoint of the reduction of the burden of the drive circuit. Moreover, in the structure having no intermediate electrode such as the structure described in Japanese Patent Application Publication No. 2001-077438, a voltage which is necessary for producing the same displacement as the actuator is the same as that of a single phase, and an effect that the drive voltage is lowered is not provided. Further, since the piezoelectric bodies having the different polarizations are directly in contact with each other, the polarization state of the interface becomes unstable, and the stability of the polarization state of the piezoelectric bodies is deteriorated. Furthermore, there is a problem that a device for repolarizing is not provided at a time when the piezoelectric bodies are depolarized.

The present invention has been contrived in view of these circumstances, an object thereof being to provide a piezoelectric device which enhances the adhesion of films in a laminated body formed by layering a plurality of piezoelectric films so as to prevent peeling, and is high in durability and reliability, to provide a piezoelectric device having good displacement efficiency (drive efficiency), to provide a manufacturing method which can manufacture the piezoelectric device mentioned above, and to provide a liquid ejection head which uses the piezoelectric device mentioned above.

In order to attain the aforementioned object, the present invention is directed to a piezoelectric device, comprising: a substrate; a first electrode which is layered over the substrate; a first piezoelectric film which is layered over the first electrode; a metal oxide film which is layered over the first piezoelectric film; a metal film which is layered over the metal oxide film; a second piezoelectric film which is layered over the metal film; and a second electrode which is layered over the second piezoelectric film, wherein a polarizing direction of the first piezoelectric film and a polarizing direction of the second piezoelectric film are different from each other.

According to this aspect of the present invention, the metal oxide film layered over the first piezoelectric film functions as a diffusion block layer, and diffusion of oxygen atoms and the piezoelectric material components from the piezoelectric film to the metal film is suppressed. Accordingly, it is possible to prevent a structure change of the metal film and a reduction of the adhesion caused by the diffusion, and it is possible to obtain the laminated structure of the piezoelectric films having a firm adhesion with the laminated structure (intermediate layer) of the metal oxide film and the metal film therebetween.

The metal film arranged between the first piezoelectric film and the second piezoelectric film is utilized as an intermediate electrode. In the case where the metal oxide film is composed of a conductive material, the intermediate electrode includes the metal oxide film and the metal film. According to this aspect of the present invention, it is possible that the first electrode and the second electrode are set to the grounded potential, and a drive voltage is applied to the intermediate electrode. In this structure, a burden of a drive circuit (a driver) is small, and a great displacement can be obtained by applying the relatively low drive voltage.

Further, since the piezoelectric device according to this aspect of the present invention has the structure in which the piezoelectric bodies having the different polarizations are layered with the intermediate electrode therebetween and are not directly in contact with each other, it is possible to avoid the problem that the polarization state of the interface becomes unstable and the stability of the polarization state of the piezoelectric bodies is deteriorated, in the case of the structure in which the piezoelectric bodies having the different polarizations are directly in contact. Furthermore, there is an advantage that it is readily to repolarize the piezoelectric bodies by utilizing the intermediate electrode at a time when the piezoelectric bodies are depolarized.

Upon interpretation, the expression "A is layered over B" is not limited to a case that A is directly layered on B while A is in contact with B, but can include a case that one or more of other layers is interposed between A and B, and A is layered over B while there is the other layer between A and B.

The structure can be made such that a construction in which the intermediate layer of the metal oxide film and the metal film is layered over the piezoelectric film and another piezoelectric film is layered over the intermediate layer, is repeated, whereby three or more piezoelectric films are layered. In this case, the piezoelectric film in the top layer can be interpreted as the "second piezoelectric film", and the piezoelectric film in the second or higher stage can be interpreted as the "second piezoelectric film".

Preferably, a product of a stress and a thickness is less than 100 $N/m^2$ in an intermediate layer constituted of the metal oxide film and the metal film between the first piezoelectric film and the second piezoelectric film.

According to this aspect of the present invention, the peeling caused by the stress due to the difference of the thermal expansion coefficients between the piezoelectric film and the intermediate layer is suppressed.

Preferably, the thickness of the intermediate layer is not smaller than 50 nm and smaller than 250 mn.

In the light of the diffusion block characteristics by the intermediate layer, and the suppression of the peeling caused by the stress due to the difference of the thermal expansion coefficients between the piezoelectric film and the intermediate layer, the structure in which the thickness of the intermediate layer is set to the range of not smaller than 50 nm and smaller than 250 nm is preferable.

Preferably, the metal oxide film includes an oxide of a metal of platinum group.

It is possible that the metal oxide film is of any oxide of any metal of the platinum group such as ruthenium (Ru), rhodium (Rh), palladium (Pd), osmium (Os), iridium (Ir), and platinum (Pt).

Preferably, the metal film includes a metal of platinum group.

The metal film can be composed of various metals, and the metal film is preferably composed of the metals of the platinum group such as Ru, Os, Rh, Ir, Pd, Pt and the like. In this case, the first electrode and the second electrode can be composed of the metals of the platinum group. Further, the first electrode and the second electrode can be composed of the metals of the copper group, copper (Cu), silver (Ag) and gold (Au).

Preferably, the first electrode and the second electrode are configured to be maintained in a grounded potential; and an intermediate electrode including the metal film between the first piezoelectric film and the second piezoelectric film is configured to be used as a drive electrode to which a drive voltage for deforming the first piezoelectric film and the second piezoelectric film is applied.

According to this aspect of the present invention, it is possible to carry out the drive control by means of one of the positive voltage and the negative voltage, and it is possible to use an inexpensive drive circuit. Moreover, since the first electrode and the second electrode are at the grounded potential, it is possible to omit or simplify the countermeasure of the current leak to the substrate, the insulation protection with respect to the upper electrode, and the like.

Preferably, when the drive voltage is applied to the intermediate electrode, each of the first piezoelectric film and the second piezoelectric film is applied with an electric field in a same direction as the polarizing direction thereof.

According to this aspect of the present invention, it is possible to obtain a great displacement by applying the electric field in the same direction as the polarizing direction of the piezoelectric film.

Preferably, each of the first piezoelectric film and the second piezoelectric film is formed by means of a vapor phase epitaxy method.

The piezoelectric films having desired piezoelectric performances can be obtained by using the vapor phase epitaxy method which is represented by the sputtering method. Further, the piezoelectric films can be readily grown on the metal film, and it is possible to achieve a good film formation.

Preferably, the vapor phase epitaxy method is a sputtering method of crystallizing by implementing a heat film formation.

According to this aspect of the present invention, since the metal oxide film functions as the diffusion block layer, it is possible to prevent the material component or the like from the piezoelectric film in the lower layer from diffusing into the metal film at a time of the heat film formation, and it is possible to obtain the laminated structure of the piezoelectric films having a high adhesion.

Preferably, each of the first piezoelectric film and the second piezoelectric film is composed of a perovskite type oxide.

The piezoelectric device of the perovskite type oxide has good piezoelectric characteristics, and can be utilized for a variety of purposes such as an actuator, a sensor, a power generating device, and the like.

Preferably, a composition of the first piezoelectric film and a composition of the second piezoelectric film are different from each other.

According to this aspect of the present invention, it is possible to combine the piezoelectric films having the appropriate compositions in correspondence to the purpose and the necessary characteristics (performance).

Preferably, at least one of the first piezoelectric film and the second piezoelectric film is composed of one or more of perovskite type oxides expressed as:

$$A_a(Zr_x, Ti_y, M_{b-x-y})_b O_c, \quad (PX)$$

where A is an A site element and at least one element including Pb; M is at least one element selected from a group consisting of V, Nb, Ta and Sb; O is oxygen, relationships $0 \leq x \leq b$, $0 < y < b$, and $0 \leq (b-x-y)$ are satisfied, and a standard mol ratio of the A site element, the B site element and oxygen is 1:1:3 but the mol ratio may deviate from the standard mol ratio within a range that enables a perovskite structure to be obtained.

According to this aspect of the present invention, the piezoelectric body has good piezoelectric characteristics, and is preferable as the piezoelectric actuator, or the like.

Preferably, one of the first piezoelectric film and the second piezoelectric film is composed of the one or more of perovskite type oxides expressed as PX; and the other of the first piezoelectric film and the second piezoelectric film is composed of one or more of perovskite type oxides expressed as:

$$ABO_3, \quad (P)$$

where A is the A site element and at least one element including Pb; B is a B site element and at least one element selected from a group consisting of Ti, Zr, V, Nb, Ta, Sb, Cr, Mo, W, Mn, Sc, Co, Cu, In, Sn, Ga, Zn, Cd, Fe and Ni, and a standard mol ratio of the A site element, the B site element and oxygen is 1:1:3 but the mol ratio may deviate from the standard mol ratio within a range that enables a perovskite structure to be obtained.

Preferably, at least one of the first piezoelectric film and the second piezoelectric film is composed of lead zirconate titanate doped with niobium.

According to this aspect of the present invention, PZT doped with Nb (PNZT) has good piezoelectric characteristics, and is preferable as the piezoelectric actuator, or the like.

Preferably, one of the first piezoelectric film and the second piezoelectric film is composed of lead zirconate titanate doped with niobium; and the other of the first piezoelectric film and the second piezoelectric film is composed of a material not doped with niobium.

In the PNZT film, the polarization state is determined to one direction just after the film formation, and it is hard to polarize in the reverse direction. On the other hand, in the film of pure PZT not doped with Nb, it is possible to comparatively freely select the polarizing direction by an after treatment. It is hard to carry out the polarization processes in two directions all at once; however, according to this aspect of the present invention, since the device formation can be achieved by the minimum polarization process, the process becomes simple.

Preferably, the polarizing direction of the one of the first piezoelectric film and the second piezoelectric film composed of lead zirconate titanate doped with niobium is a direction from the substrate toward the second electrode.

According to this aspect of the present invention, in the case where the polarization state at a time of the film formation can be utilized as it is, the additional polarization process is not necessary.

Preferably, the material not doped with niobium is pure lead zirconate titanate.

According to this aspect of the present invention, it is possible to change the polarizing direction by carrying out the polarization process with respect to the pure PZT film.

Preferably, the polarizing directions of the first and second piezoelectric films are parallel to thickness directions of the respective films and are reverse to each other.

In order to attain the aforementioned object, the present invention is also directed to a liquid ejection head, comprising: a nozzle which is an ejection port configured to eject liquid; a pressure chamber which contains the liquid and is connected to the nozzle; and the piezoelectric device as defined in claim 1 which is arranged correspondingly to the pressure chamber and is configured to function as an ejection energy generating device to generate an energy to eject the liquid in the pressure chamber through the nozzle.

According to this aspect of the present invention, it is possible to achieve the liquid ejection head having good ejection efficiency. Further, a burden of the drive circuit can be reduced, and an inexpensive circuit structure can be achieved.

In order to attain the aforementioned object, the present invention is also directed to a manufacturing method of a piezoelectric device, the method comprising: a first electrode formation step of layering a first electrode over a substrate; a first piezoelectric film formation step of layering a first piezoelectric film over the first electrode; a metal oxide film formation step of layering a metal oxide film over the first piezoelectric film; a metal film formation step of layering a metal film over the metal oxide film; a second piezoelectric film formation step of layering a second piezoelectric film over the metal film; a second electrode formation step of layering a second electrode over the second piezoelectric film; and a polarization process step of differentiating a polarizing direction of the first piezoelectric film and a polarizing direction of the second piezoelectric film from each other.

According to this aspect of the present invention, it is possible to prevent a structure change of the metal film and a reduction of the adhesion caused by the diffusion, and it is possible to obtain the laminated structure of the piezoelectric films having a firm adhesion.

Preferably, each of the first piezoelectric film formation step and the second piezoelectric film formation step includes a vapor phase epitaxy method.

According to the present invention, it is possible to prevent the peeling of the films and the reduction of the adhesion which come to the problem in the laminated bodies in the related art, and it is possible to form a laminated body of a plurality of piezoelectric films. Thus, it is possible to obtain a piezoelectric device which is high in durability and reliability. Further, according to the piezoelectric device of the present invention, it is possible to achieve an improvement of the displacement efficiency and it is possible to drive by the relatively low drive voltage with a reduced burden of the drive circuit.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 6 is a table showing results of experiments about a relationship between a thickness of an intermediate layer and a peeling;

FIG. 8 is a table of polarizing methods and drive voltages in the first and second practical examples and the second comparative example.

DETAILED DESCRIPTION OF THE PREFERRED EMBODIMENTS

<Embodiment>

Figure 1:
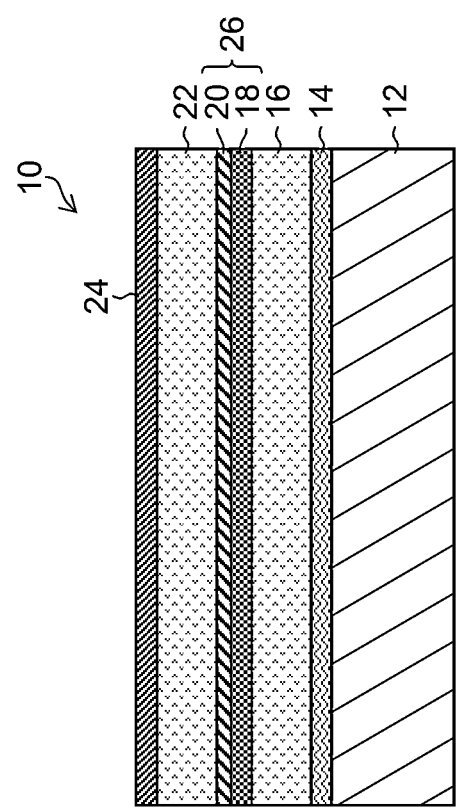
FIG. 1 is a cross sectional view showing a structure of a piezoelectric device according to an embodiment of the present invention.

FIG. 1 is a cross sectional view showing a structure of a piezoelectric device according to an embodiment of the present invention. The piezoelectric device 10 shown in FIG. 1 has a laminated structure in which a first electrode 14 is formed on a substrate 12 functioning as a support body, a first piezoelectric film 16 is formed thereon, and a metal oxide film 18, a metal film 20, a second piezoelectric film 22 and a second electrode 24 are formed in layers further thereon in this order.

Here, in FIG. 1 and the other drawings, film thicknesses of the layers and a rate thereof are drawn while being appropriately changed for convenience of explanation, and are not necessarily shown by reflecting the actual film thicknesses and rate. Further, in the present specification, when describing the laminated structure, a direction of being away from the surface of the substrate 12 in a thickness direction of the substrate 12 is expressed as the "upper" direction. In FIG. 1, since the piezoelectric device 10 is structured such that the layers 14 to 24 are sequentially layered on the upper surface of the substrate 12 in a state of retaining the substrate 12 horizontally, the arrangement of the layers coincides with an upper and lower relationship at a time of setting the direction of the gravitational force (the lower direction in FIG. 1) to the downward direction. In this case, an attitude of the substrate 12 can be inclined or inverted. In order to express the upper and lower relationship of the laminated structure without confusion even in the case that the laminating direction of the laminated structure which depends on the attitude of the substrate 12 does not necessarily coincide with the upper and lower direction on the basis of the direction of the gravitational force, a direction of being away from the surface of the substrate 12 in the thickness direction of the substrate 12 is expressed as the upper direction. For example, even in the case that the upper and lower sides in FIG. 1 are inverted, it is described by an expression that the first electrode 14 is formed over the upper surface of substrate 12, and the first piezoelectric film 16 is layered over the upper surface of the first electrode 14.

The piezoelectric device 10 shown in FIG. 1 has the laminated structure in which the two piezoelectric films (the first piezoelectric film 16 and the second piezoelectric film 22) are layered with an intermediate layer 26 therebetween. The intermediate layer 26 has a laminated structure of the metal oxide film 18 and the metal film 20. The first electrode 14 is arranged on the lower side of the two piezoelectric films 16 and 22, and the second electrode 24 is arranged on the top surface.

Although the two piezoelectric films 16 and 22 are hereby exemplified, it is also possible that three or more piezoelectric films are layered while interposing intermediate layers (each corresponding to the intermediate layer 26 in FIG. 1), in implementation of the present invention. In this case, the intermediate layer (corresponding to the intermediate layer 26 in FIG. 1) is formed in place of the second electrode 24 in FIG. 1, thereby forming a laminated structure in which the piezoelectric films and the intermediate layers are alternately layered. On the assumption that a number of stages (a laminating number) at which the piezoelectric films are layered is n (where n is an integer larger than 1), the intermediate layers are formed at (n−1) layers. Further, the second electrode such as the second electrode 24 in FIG. 1 is formed on the piezoelectric film of the top layer (the n-th layer).

A material of the substrate 12 is not particularly limited, and can employ various materials, for example, silicon (Si), glass, ceramics, silicon oxide, stainless steel (SUS), yttria stabilized zirconia (YSZ), alumina, sapphire, SiC, $SrTiO_3$, and the like. Further, the substrate 12 can be a laminated substrate such as a silicon-on-insulator (SOI) substrate in which an $SiO_2$ film and an Si active layer are arranged sequentially on a silicon substrate.

The first electrode 14 can be composed of various materials such as platinum (Pt), aluminum (Al), molybdenum (Mo), titanium nitride (TiN), ruthenium (Ru), gold (Au), silver (Ag), and the like. It is preferable that the first electrode 14 includes a metal of the platinum group (Ru, Rh, Pd, Os, Ir, Pt). It is also preferable that the first electrode 14 has an adhesion layer of Ti or TiW (titanium-tungsten), in order to enhance the adhesion with the substrate 12. It is further preferable that the first electrode 14 has a laminated structure of the adhesion layer arranged on the substrate 12 and the layer of metal of the platinum group arranged on the adhesion layer.

The second electrode 24 can be composed of various materials similarly to the first electrode 14. It is preferable that the second electrode 24 includes a metal of the platinum group or the copper group (Cu, Ag, Au). It is further preferable that the second electrode 24 has a laminated structure of an adhesion layer of Ti or TiW and a layer of metal of the platinum group arranged on the adhesion layer. The first electrode 14 and the second electrode 24 can be composed of the same material, or can be composed of different materials. For example, it is possible that the first electrode 14 has the laminated structure of TiW/Pt and the second electrode 24 has the laminated structure of TiW/Au. The thicknesses of the first electrode 14 and the second electrode 24 are not particularly limited, and are preferably between 50 nm and 500 nm.

The metal oxide film 18 functions as a diffusion block layer that prevents diffusion of oxygen atoms or piezoelectric material components from the piezoelectric film 16 of the first layer. The metal oxide film 18 can be a conductive body or an insulating body. It is preferable that the metal oxide film 18 includes an oxide of a metal of the platinum group or the titanium group (Ti, Zr, Hf). For example, the metal oxide film 18 can be composed of an oxide of Ir (which is referred to as "$IrO_x$" or "Ir—O"), or an oxide of Ti (e.g., TiO, $TiO_2$, or the like).

The metal film 20 formed over the metal oxide film 18 plays a part which is useful for forming the piezoelectric film 22 of the second layer by means of the vapor phase epitaxy (the sputtering method, or the like). The piezoelectric film used in the present embodiment is hard to be grown on the oxide, and is easy to be grown on the metal. Accordingly, it is preferable that the metal film 20 is arranged on the metal oxide film 18, and the piezoelectric film (the second piezoelectric film 22) is formed on the metal film 20. The material of the metal film 20 is not particularly limited, and the metal film 20 preferably includes a metal of the platinum group, for example, Ir, Pr and the like.

The intermediate layer 26 having the laminated structure of the metal oxide film 18 and the metal film 20 can be used as an intermediate electrode. In the case where the intermediate layer 26 is used as the intermediate electrode, it is preferable that the metal oxide film 18 is composed of a conductive material. Even in the case where the metal oxide film 18 is composed of the insulating material, it is possible to use the metal film 20 as the intermediate electrode.

The structure of the intermediate layer 26 can be either amorphous or crystal. A surface roughness and a structure of the film (a columnar structure, a granular structure, or the like) of the intermediate layer 26 are not particularly limited. Further, orientations and a degree of preferred orientations of the crystals of the intermediate layer 26 are not limited. It is preferable that the intermediate layer 26 includes an oxide (the metal oxide film 18); however, it can include nitrogen.

Each of the first piezoelectric film 16 and the second piezoelectric film 22 is formed by crystallizing by rising a substrate temperature while the film formation by means of the vapor phase epitaxy method. The material of the first piezoelectric film 16 and the second piezoelectric film 22 is not particularly limited as long as it is the oxide piezoelectric body. The first piezoelectric film 16 and the second piezoelectric film 22 can be composed of the same material or can be composed of different materials. In the implementation of the present invention, it is preferable that the compositions are differentiated between the first piezoelectric film 16 and the second piezoelectric film 22.

For example, it is possible that one of the first piezoelectric film 16 and the second piezoelectric film 22 is composed of lead zirconate titanate (PZT) doped with niobium (Nb), and the other is composed of PZT not doped with Nb.

Moreover, the polarizing directions are different between the first piezoelectric film 16 (the first layer) and the second piezoelectric film 22 (the second layer). For example, the polarizing direction of the first layer is the downward direction (the direction from the intermediate electrode toward the lower electrode), and the polarizing direction of the second layer is the upward direction (the direction from the intermediate electrode toward the upper electrode). It is also possible to employ an aspect that the polarizing direction of the first layer is the upward direction and the polarizing direction of the second layer is the downward direction. Further, without being limited to the relationship that the polarizing direction of the first layer and the polarizing direction of the second layer are parallel and inverted to each other, it is also possible to employ a relationship that the polarizing directions of the layers are not parallel to each other, such as the polarizing directions are orthogonal.

In order to obtain the desired polarization state, a polarization process is carried out by a method of applying a voltage between the pair of electrodes facing each other across the piezoelectric film. The polarization process can accompany a heating process. Further, a method such as a corona method or the like can be employed as the method of the polarization process. In the case where the polarization state at a time of forming the piezoelectric film can be utilized as it is, the polarization process can be omitted.

<Inquiry into Cause of Peeling>

The present inventors have inquired into the cause by which the peeling of the electrodes and the piezoelectric films is generated in the case of manufacturing the laminated body in which the piezoelectric films and the electrodes are alternately layered in the related art, and have found that oxygen atoms and the piezoelectric material component (for example, lead (Pb) or the like in the case of the PZT material) are diffused into the electrode from the piezoelectric material, at the film formation temperature at a time of forming the piezoelectric body, thereby causing a structure change of the electrode material and a reduction of the adhesion so as to peel off. Then, the present inventors have found that, in order to prevent the peeling of the electrodes and the piezoelectric films to obtain a device having a high durability, it is useful to obstruct (block) the diffusion of the component of the piezoelectric material in the piezoelectric film formed on the substrate into the electrode layer, and it is particularly important to block the diffusion of oxygen atoms.

On the basis of the knowledge mentioned above, in the embodiment of the present invention, after forming the piezoelectric film of the first layer (the first piezoelectric film 16), the metal oxide film 18 functioning as the diffusion block layer is formed over the piezoelectric film 16 of the first layer, and the diffusion from the piezoelectric film of the first layer (the first piezoelectric film 16) is blocked by the metal oxide film 18. Further, the metal film 20 is formed over the metal oxide film 18, and the piezoelectric film of the second layer (the second piezoelectric film 22) is formed over the metal film 20. In other words, the intermediate layer having the laminated structure of the metal oxide film and the metal film is interposed between the piezoelectric film of the first layer and the piezoelectric film of the second layer, and the piezoelectric films are arranged in layers with the intermediate layer therebetween. By repeating the steps mentioned above, it is possible to layer the piezoelectric films while ensuring the firm adhesion.

<First Practical Example>

FIGS. 2A to 2I are views showing a manufacturing process of a piezoelectric device according to a first practical example of the present invention.

Figure 2A:
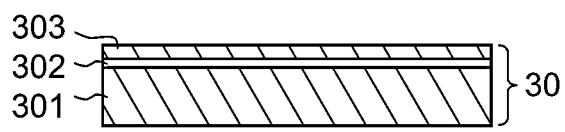
FIGS. 2A to 2I are explanatory views showing a manufacturing process of a piezoelectric device in a first practical example of the present invention.
Figure 2B:
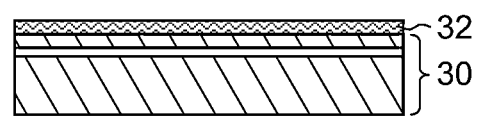

Step 1: First of all, a silicon-on-insulator (SOI) substrate 30 was prepared (FIG. 2A). The SOI substrate 30 has a laminated structure in which an Si layer 301 functioning as a handle layer, an oxide film layer ($SiO_2$) layer 302 functioning as an insulating layer (a BOX layer) and an Si layer 303 functioning as a device layer are arranged. In place of the SOI substrate 30, a normal silicon substrate (an Si wafer) can be used.

Step 2: A film of TiW was formed at a film thickness of 20 nm on the Si layer 303 (the upper surface in FIG. 2B) of the SOI substrate 30 by means of the sputtering method, and a film of Ir was formed at a film thickness of 150 nm thereon. A lower electrode 32 was thereby formed to have a laminated structure of the TiW film of 20 nm and the Ir film of 150 nm.

Figure 2C:
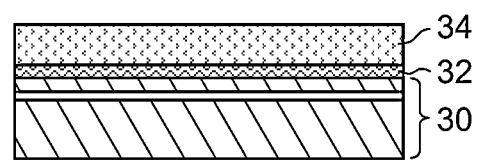

Step 3: Thereafter, a film 34 of pure (without any dopant) lead zirconate titanate was formed at a film thickness of 2 μm the lower electrode 32 at a film formation temperature of 500° C. by means of the sputtering method (FIG. 2C). In the formation of the PZT film 34, a radio frequency (RF) magnetron sputter apparatus was used, a film formation gas was a mixed gas of Ar of 97.5 vol. % and $O_2$ of 2.5 vol. %, a target was a material having composition of $Pb_{1.3}Zr_{0.52}Ti_{0.48}O_3$, and a film formation pressure was 0.5 Pa.

Figure 2D:
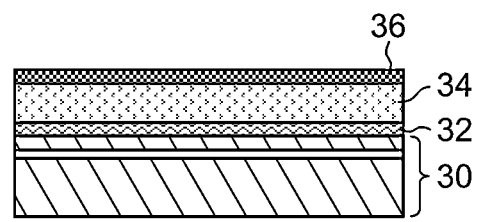

Step 4: An Ir—O film 36 was formed at a film thickness of 50 nm on the PZT film 34 at a film formation temperature of 350° C. by means of the sputtering method (FIG. 2D).

Figure 2E:
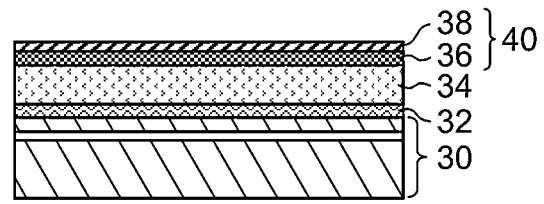

Step 5: An Ir film 38 was formed at a film thickness of 20 nm on the Ir—O film 36 (FIG. 2E). An intermediate layer or electrode 40 was thereby formed to have a laminated structure of the Ir—O film 36 and the Ir film 38.

The formation of the Ir—O film 36 was carried out by a mixed gas of 50% Ar and 50% $O_2$ at a pressure of 0.5 Pa by means of the reactive sputtering method using an Ir target. Further, the Ir film 38 was obtained by using only the Ar gas as the film formation gas after the formation of the Ir—O film 36.

The Ir—O film 36 functions as a block to prevent the diffusion of lead and oxygen from the PZT film 34 of the first layer. Further, the Jr film 38 formed on the Ir—O film 36 was inserted for lowering the electric resistance of the intermediate electrode, and also for carrying out a growth of another PZT film of the next layer under the same conditions as the growth of the initial (first) PZT film. The film formation temperature of the Ir—O film 36 and the Jr film 38 was 350° C. in the present example for improving the adhesion and lowering the electric resistance rate; however, it can be a room temperature or can be a higher temperature. The same results were obtained by actual experimentations while changing the temperature.

Figure 2F:
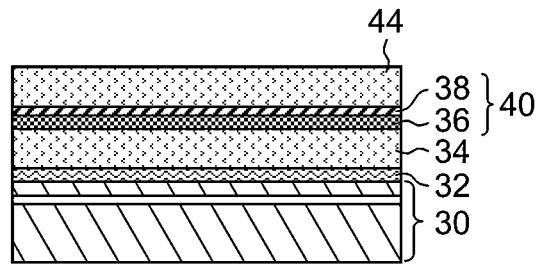

Step 6: After forming the intermediate electrode 40, a film 44 of lead zirconate titanate doped with niobium (Nb) (hereinafter referred to as "PZT", or "PNZT" when necessary to be differentiated from "pure PZT" to which no dopant such as Nb or the like is added) was formed thereon as the second piezoelectric layer (FIG. 2F). In the formation of the PZT film 44, the radio frequency (RF) magnetron sputter apparatus was used, a film formation gas was a mixed gas of Ar of 97.5 vol. % and $O_2$ of 2.5 vol. %, a target was a material having composition of $Pb_{1.3}((Zr_{0.52}Ti_{0.48})_{0.88}Nb_{0.12})O_3$, and a film formation pressure was 2.2 mTorr. The film thickness of the PZT film 44 of the second layer was about 2 μm.

Figure 2G:
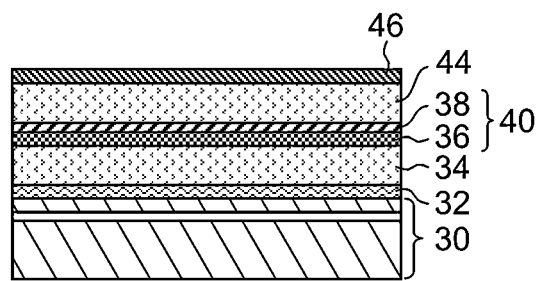

Step 7: Thereafter, an upper electrode 46 was formed on the PZT film 44 of the second layer (FIG. 2G). The upper electrode 46 was structured in the same manner as the lower electrode 32 such that a TiW film was formed at a film thickness of 20 nm by means of the sputtering method, and an Ir film was layered thereon so as to be formed at a film thickness of 150 nm. The upper electrode 46 was thereby formed to have a laminated structure of the TiW film of 20 nm and the Ir film of 150 nm. Thus, a laminated body as shown in FIG. 2G was obtained.

Figure 2H:
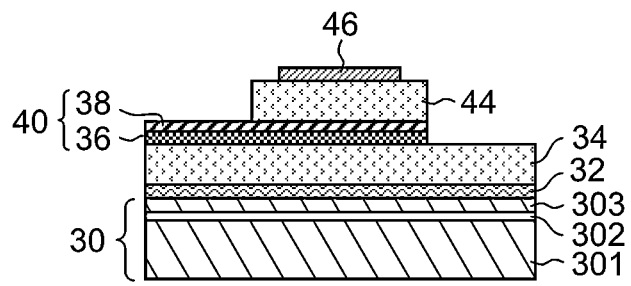

Step 8: As shown in FIG. 2H, a desired shape was formed by etching the PZT film 44 of the second layer in the laminated body. In this case, it is possible to employ an aspect that the PZT film 44 is formed after patterning the Ir—O film and the Ir film. The second electrode can be patterned after forming the PZT film 44 in a desired shape.

Figure 2I:
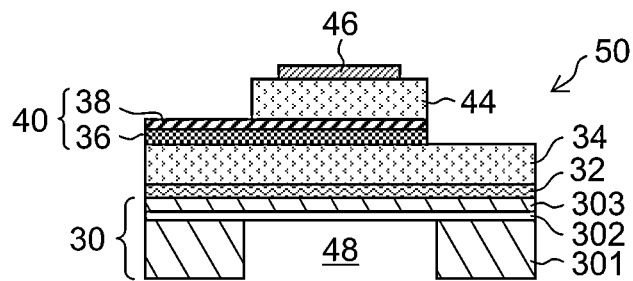

Step 9: Finally, with respect to the thus obtained wafer structure, a cavity structure was produced as shown in FIG. 2I by removing a part of a back surface side (a lower surface side) of the SOI substrate 30, that is, the Si layer 301, by etching or the like, while leaving the Si layer 303 (the device layer) at a thickness of 5 μm as a diaphragm. In this case, the $SiO_2$ layer 302 functions as an etching stop layer, and the diaphragm is constituted of the $SiO_2$ layer 302 and the Si layer 303 while leaving the $SiO_2$ layer 302 in FIG. 2I; however, the diaphragm can be constructed by removing the $SiO_2$ layer 302.

A structure body 50 shown in FIG. 2I was obtained by the process mentioned above. The structure body 50 as shown in FIG. 2I is applied, for example, to an inkjet head. A recessed space 48 which is formed by the etching corresponds to an ink chamber (a pressure chamber).

<<Correspondence of Structure in FIG. 2I to Structure in FIG. 1>>

The SOI substrate 30 in FIG. 2I corresponds to the substrate 12 in FIG. 1. The lower electrode 32 in FIG. 2I corresponds to the first electrode 14 in FIG. 1. The pure PZT film 34 in FIG. 2G corresponds to the first piezoelectric film 16 in FIG. 1, and the PZT film 44 in FIG. 2I corresponds to the second piezoelectric film 22 in FIG. 1. The Ir—O film 36 in FIG. 2I corresponds to the metal oxide film 18 in FIG. 1, and the Jr film 38 in FIG. 2I corresponds to the metal film 20 in FIG. 1. The upper electrode 46 in FIG. 2I corresponds to the second electrode 24 in FIG. 1.

Figure 3:
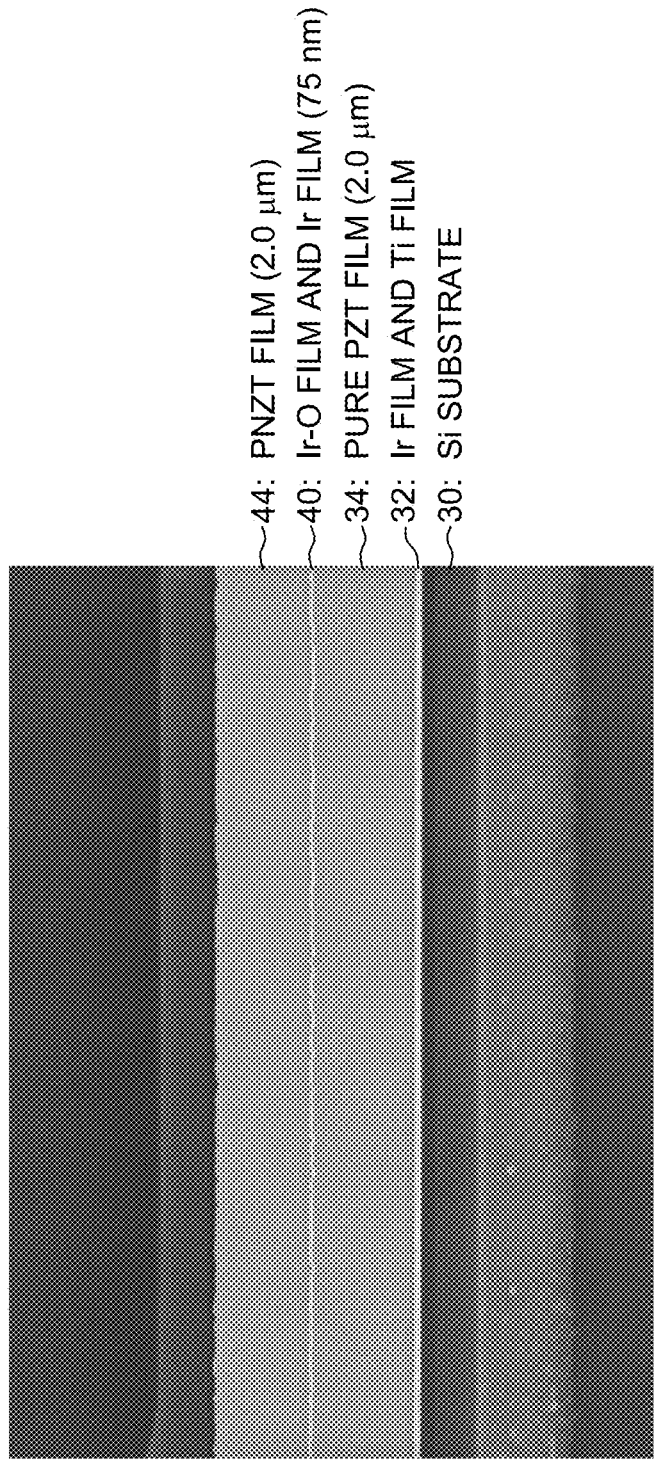
FIG. 3 is a scanning electron microscopy (SEM) image showing a structure of a laminated body of piezoelectric films produced in the first practical example.

For reference, FIG. 3 shows a scanning electron microscopy (SEM) image of the laminated structure of the films in the state in which the PZT film 44 of the second layer was formed by Step 6. The laminated body shown in FIG. 3 was obtained by Steps 1 to 6. As shown in FIG. 3, the two PZT films 34 and 44 were layered with firm adhesion with the intermediate electrode 40 therebetween, and a good laminated body having no peeling was obtained.

<<XRD Characteristics>>

Figure 4:
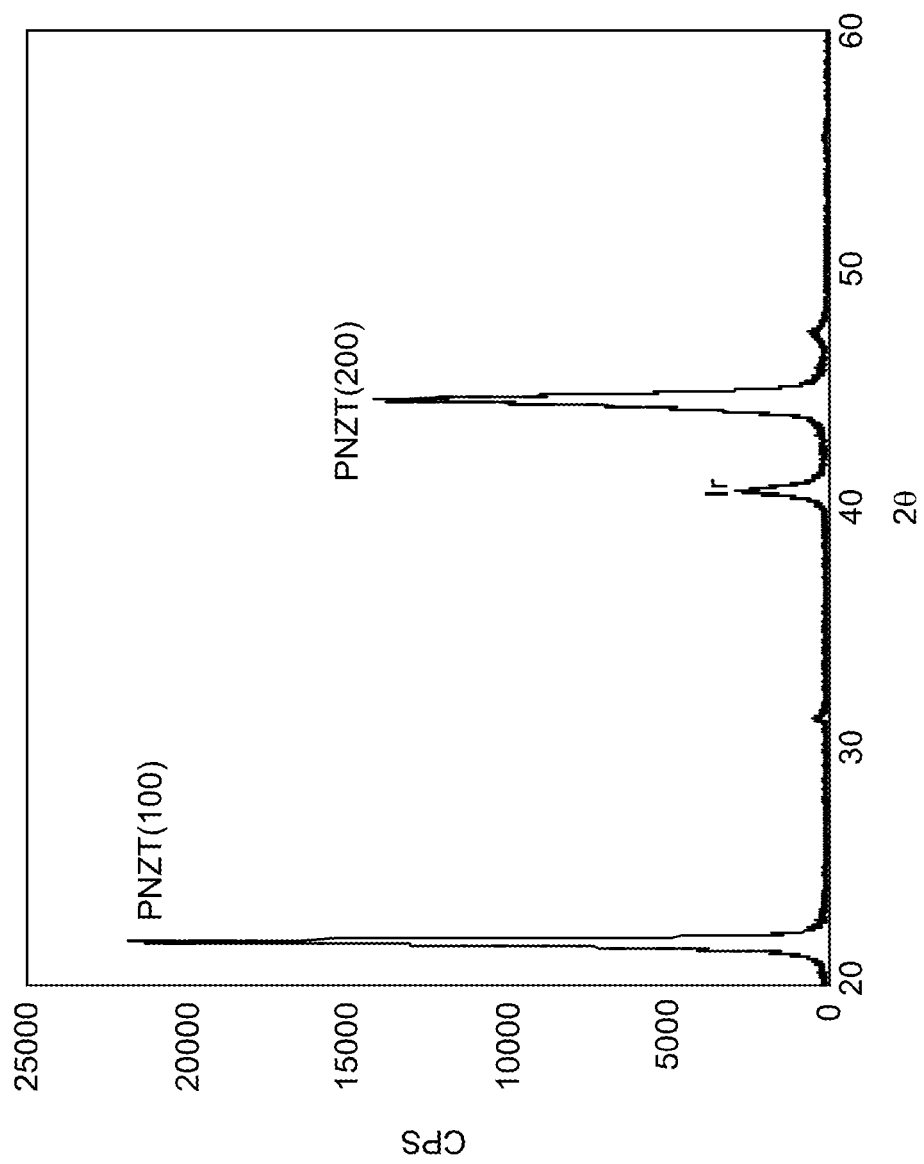
FIG. 4 is a view showing X-ray diffraction (XRD) characteristics of the piezoelectric films produced in the first practical example.

FIG. 4 shows a result of analyzing the laminated structure of the two piezoelectric films (shown in FIG. 2G) which was obtained in the first practical example, by means of the X-ray diffraction (XRD). In FIG. 4, the horizontal axis indicates the diffraction angle 2θ, and the vertical axis indicates the diffraction intensity. In the analysis of the crystal structures by means of the X-ray diffraction, the laminated body constituted of the two piezoelectric films was irradiated with the X-ray from the above in a lump. As illustrated, the PNZT films obtained in the present example exhibited the diffraction patterns highly concentrated at the PNZT crystal planes (100) and (200), and were confirmed as the highly oriented piezoelectric films having (100) and (001) as the crystal preferred orientations. It was possible to well form the piezoelectric films having the excellent crystallinity without any heterogeneous phase, in accordance with the method described in the first practical example.

<Film Formation Method>

As the film formation method of the piezoelectric film, the vapor phase epitaxy method is preferable. It is possible to apply various methods, for example, an ion plating method, a metal organic chemical vapor (MOCVD) deposition method, a pulse laser deposition (PLD) method, and the like in addition to the sputtering method. Further, there can be thought that the other methods (for example, a sol-gel method and the like) than the vapor phase epitaxy method are used.

<Piezoelectric Material>

The piezoelectric materials which are preferable in the present embodiment include one or more types of perovskite type oxide (P) as expressed by the following general formula:

$$ABO_3, \quad (P)$$

where A is an A site element and at least one element including Pb; B is a B site element and at least one element selected from the group consisting of Ti, Zr, V, Nb, Ta, Sb, Cr, Mo, W, Mn, Sc, Co, Cu, In, Sn, Ga, Zn, Cd, Fe and Ni; O is oxygen; and the standard mol ratio of the A site element, the B site element and oxygen is 1:1:3, but the mol ratio may deviate from the standard mol ratio within a range that enables a perovskite structure to be obtained.

A perovskite type oxide expressed by the above-described general formula can be: one of lead-containing compounds, such as lead titanate, lead zirconate titanate (PZT), lead zirconate, lead lanthanum titanate, lead lanthanum zirconate titanate, lead magnesium niobate zirconium titanate, nickel niobate lead zirconium titanate, lead zinc niobate zirconium titanate, or the like, or mixed crystal systems of these; or one of non-lead-containing compounds, such as barium titanate, strontium barium titanate, bismuth sodium titanate, bismuth potassium titanate, sodium niobate, potassium niobate, lithium niobate, bismuth ferrite, or the like, or mixed crystal systems of these.

The piezoelectric film according to the present embodiment desirably contains one or more types of perovskite type oxide (PX) as expressed by the following formula:

$$A_a(Zr_x, Ti_y, M_{b-x-y})_bO_c \qquad (PX)$$

where A is an A site element and at least one element including Pb; M is at least one element selected from the group consisting of V, Nb, Ta and Sb; the relationships $0<x<b$, $0<y<b$, and $0 \leq (b-x-y)$ are satisfied; and a:b:c=1:1:3 is standard, but the mol ratio may deviate from the standard mol ratio within a range that enables a perovskite structure to be obtained.

Since the piezoelectric film composed of the perovskite type oxide represented by the general expression (P) or (PX) mentioned above has a high piezoelectric strain constant ($d_{31}$ constant), the piezoelectric actuator that is provided with the piezoelectric film mentioned above becomes excellent in a displacement characteristic. In this case, the piezoelectric constant becomes higher in the piezoelectric film composed of the perovskite type oxide represented by the general expression (PX) than in the piezoelectric film composed of the perovskite type oxide represented by the general expression (P).

Further, the piezoelectric actuator provided with the piezoelectric film composed of the perovskite type oxide represented by the general expression (P) or (PX) has the voltage-displacement characteristics of excellent linearity in a range of the drive voltage. The piezoelectric materials exhibit the piezoelectric characteristics which are good for implementation of the present invention.

<Polarizing Directions of Piezoelectric Films>

In the present example, the piezoelectric film 34 of the first layer and the piezoelectric film 44 of the second layer were formed of the different piezoelectric materials, and the polarizing directions of the piezoelectric films of the respective layers were different from each other. The polarizing direction is defined by a vector direction (a direction from negative to positive) of a dipole moment caused by a deviation of an electric charge distribution.

With regard to the pure PZT film 34 of the first layer, the polarization process was carried out for five minutes by applying +30 V to the intermediate electrode 40 and setting the lower electrode 32 to the grounded potential, in such a manner as to make the polarizing direction to the downward direction (the direction from the intermediate electrode 40 toward the lower electrode 32). The polarization process can include a heating, and can be another method such as a corona method, or the like.

On the other hand, the PNZT film 44 of the second layer was obtained as the structure in which the polarizing direction was the upward direction (the direction from the intermediate electrode 40 toward the upper electrode 46) upon the film formation thereof.

When an electric field is applied to the piezoelectric body in the same direction as the polarizing direction of the piezoelectric body, the piezoelectric body is going to contract within a surface of the diaphragm on the basis of the piezoelectric transverse effect ($d_{31}$ mode). When the piezoelectric film formed on the diaphragm contracts within the surface of the diaphragm, the diaphragm constrains the deformation of the piezoelectric film. Therefore, the diaphragm deforms to deflect (bend) in the thickness direction.

Figure 5:
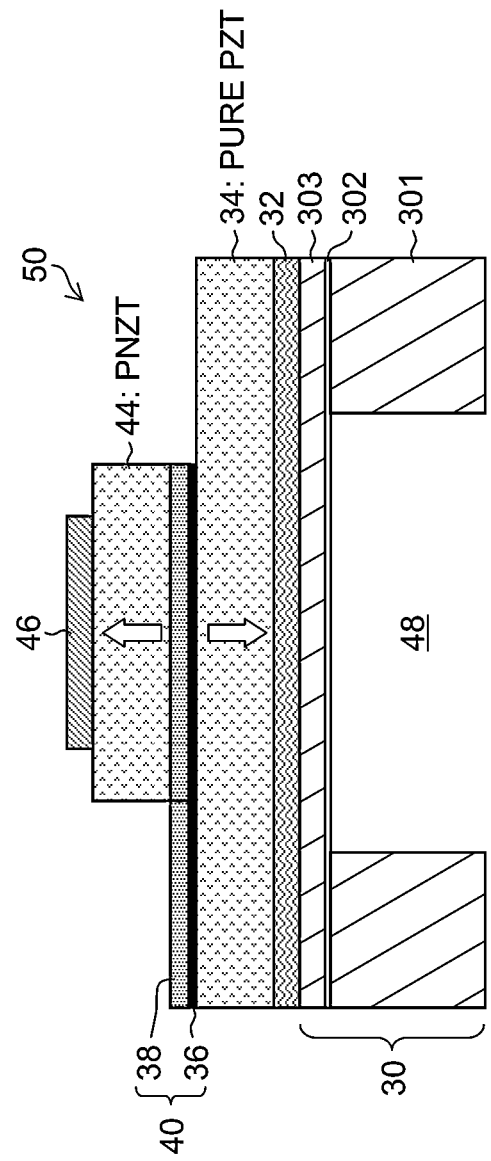
FIG. 5 is a view of a structure of a piezoelectric device produced in the first practical example.

FIG. 5 schematically shows the polarizing directions of the piezoelectric films 34 and 44 with the outlined arrows, with regard to the device 50 obtained in the first practical example. In the device 50 obtained in the first practical example, when the upper electrode 46 and the lower electrode 32 were set to the grounded potential and the intermediate electrode 40 was applied with +9 V, a displacement of about 82 nm was obtained.

<First Comparative Example>

As a first comparative example, a laminated body was prepared in accordance with the following procedures. After a TiW film of 20 nm and an Jr film of 150 nm were layered on a Si substrate, a PZT film was formed thereon at a film thickness of 2 μM at a substrate temperature (a film formation temperature) 500° C. by means of the sputtering method. After the film formation, an Ir film of 70 nm was formed directly on the PZT film at 350° C. Thus, the laminated body in the first comparative example had a structure such that the Ir—O film functioning as the metal oxide film 18 was omitted from the structure (FIG. 1) of the first embodiment.

After forming the intermediate electrode of the Ir film of 70 nm, the PZT film of the second layer was formed directly on the intermediate electrode. The forming conditions were the same as the conditions of the first layer, and it was formed by targeting on 2 μm thickness.

However, taking out the sample from the film formation apparatus after the film formation step, the PZT film of the second layer was in a peeled state. It was considered that this was caused by a matter that the Jr electrode was oxidized at a time of forming the PZT film of the second layer, the Ir electrode chemically changed so as to change its volume due to a diffusion of the piezoelectric material component Pb from the PZT film of the first layer, and the PZT film peeled off from the Ir electrode (the intermediate electrode).

Making an attempt to produce an aspect that the intermediate electrode of the Ir film was changed to an intermediate electrode of a Pt film, and an aspect that the Jr electrode (or the Pt electrode) was formed after forming a Ti or TiW film as the adhesion layer; however, the peeling of the piezoelectric film of the second layer was generated in the same manner as mentioned above. Further, the same sample production was carried out by changing the film thickness of the Ir film functioning as the intermediate electrode in the first comparative example to 50 nm, 120 nm, 150 nm, 200 nm and 250 nm; however, the peeling of the piezoelectric film of the second layer was generated in all the cases.

<Relationship between Thickness of Intermediate Layer (Intermediate Electrode) and Peeling>

With regard to the laminated bodies according to the present embodiment, a relationship between the thickness of the intermediate layer and the peeling was investigated, and a result in a table shown in FIG. 6 was obtained. The intermediate layers in the practical examples A to E in FIG. 6 were the layers which included the metal oxide film 18 and the metal film 20 as described in the first practical example. The intermediate layer can have a laminated structure of an IrO$_x$ film and an Ir film, for example, as described in FIG. 1, or can have a laminated structure of a film of an insulating material such as TiO$_2$ and a film of a metal such as Ir.

Here, an experiment was carried out by changing the thicknesses of the intermediate layer in the laminated structure which is exemplified in FIGS. 1 to 4. As shown in the practical examples A to D in the table in FIG. 6, if the thickness of the intermediate layer was thin (not larger than 200 nm), no peeling occurred. However, if the thickness of the intermediate layer became extremely thin, for example, in the case that it was smaller than 50 nm, there might be generated another problem such as a resistance became relatively high as the electrode, or the characteristics of blocking the diffusion from the PZT of the lower layer (the first layer) were lowered.

On the other hand, as shown in the comparative example in the table in FIG. 6, the upper piezoelectric body (the second layer) peeled off in the structure in which the thickness of the intermediate layer was not smaller than 250 nm. The upper piezoelectric body was assumed to peel off due to a stress caused by a difference in the thermal expansion coefficients between the piezoelectric body and the intermediate layer, or the like. As shown in the practical example E, a partly peeled state was observed in the case that the thickness of the intermediate layer was 200 nm, however, it can be thought that a practically allowable case may be provided. The thickness of 200 nm of the intermediate layer is hence considered as a threshold (an upper limit) of an allowable level.

On the basis of the points mentioned above, it is preferable that the thickness of the intermediate layer is not smaller than 50 nm and not larger than 200 nm, more preferably not smaller than 50 nm and smaller than 200 nm, and further preferably not smaller than 50 nm and not larger than 150 nm.

In the above descriptions, the evaluations have been carried out by using the thickness of the intermediate layer as a parameter; however, the stress is a main factor with regard to with or without the peeling. Calculating the stress of the intermediate layer having the thickness shown in the table in FIG. 6, it was about 500 MPa in the intermediate layer having the thickness of 200 nm. In other words, considering a preferable condition of the intermediate layer on the basis of a relationship between the thickness and the stress, it is preferable that a product of the stress and the thickness (stress× thickness) of the intermediate layer is not larger than 100 N/m$^2$. In this case, the stress of the intermediate layer may be zero.

The product of the stress and the thickness is considered as a general index which does not depend on the material. In the light of suppression of the peeling caused by the stress caused by the difference between the thermal expansion coefficients as well as employing the structure that prevents the peeling caused by the diffusion (the structure in which the piezoelectric film is layered on the intermediate layer including the metal oxide film functioning as the diffusion block layer), it is more preferable that the product of the stress and the thickness of the intermediate layer is less than 100 N/m$^2$, and more preferably not larger than 75 N/m$^2$. Here, the smaller the product of the stress and the thickness of the intermediate layer is (the closer to zero it is), the smaller the influence of the stress caused by the difference between the thermal expansion coefficients is. Accordingly, it is insignificant to define a preferable lower limit with regard to the product of the stress and the thickness of the intermediate layer.

<Second Practical Example>

Figure 7:
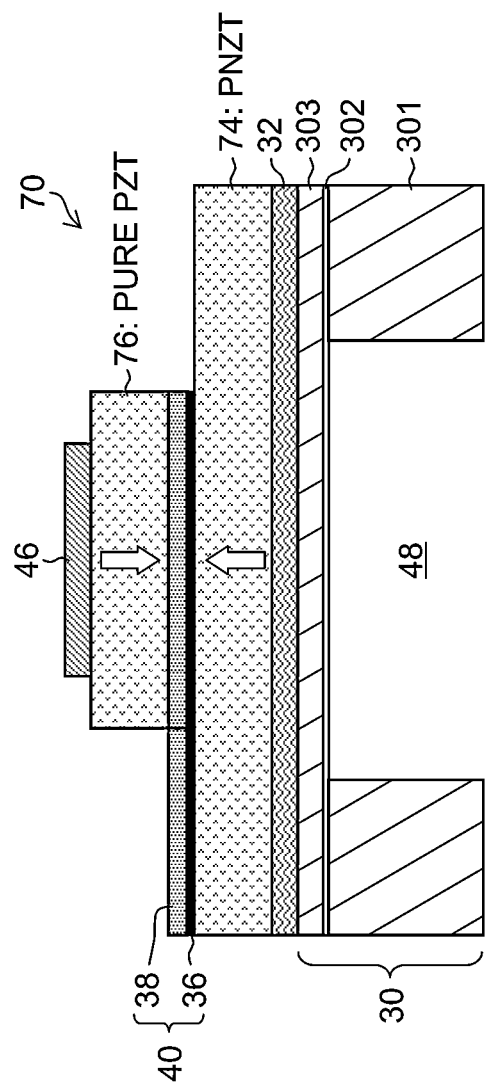
FIG. 7 is a view of a structure of a piezoelectric device according to a second practical example of the present invention.

FIG. 7 is a schematic view of a device which is obtained according to a second practical example of the present invention. In FIG. 7, the same or similar elements as those in FIG. 5 are denoted with the same reference numerals, and description thereof is omitted.

In the second practical example, a device 70 similar to the device 50 obtained in the first practical example was prepared. In the second practical example, a piezoelectric film 74 of the first layer was composed of Nb doped PZT (PNZT), and a piezoelectric film 76 of the second layer was composed of the pure PZT. In other words, the PNZT film 74 in FIG. 7 had the same composition as the PNZT film 44 in FIG. 5, and the pure PZT film 76 in FIG. 7 had the same composition as the pure PZT film 34 in FIG. 5. The polarization process was carried out with respect to the pure PZT film 76 in the same manner as the first practical example, and the polarization state as shown with the outlined arrows in FIG. 7 was obtained. More specifically, the polarizing direction of the piezoelectric body 74 of the first layer was the upward direction, and the polarizing direction of the piezoelectric body 76 of the second layer was a downward direction.

In the device 70 obtained as described above, when the lower electrode 32 and the upper electrode 46 were set to the grounded potential and the intermediate electrode 40 was applied with −9 V, a displacement of about 81 nm was obtained.

<Second Comparative Example>

In a second comparative example, a device was prepared to have a structure similar to the device 50 in the first practical example, but the piezoelectric bodies of the first and second layers were both composed of Nb doped PZT (PNZT). Further, the polarizing directions of the piezoelectric bodies of the first and second layers were set to the same direction (here, the upward direction).

With regard to the device in the second comparative example, the optimum directions of voltage application were selected in accordance with the polarizing directions of the piezoelectric bodies, +9 V was applied to the lower electrode, the intermediate electrode was grounded, and −9 V was applied to the upper electrode. As a result, a displacement of 96 nm was obtained. However, the absolute value of the drive voltage is 18 V, which is greater than the drive voltage of the first and second practical examples. Moreover, in the second comparative example, the driver corresponding to the positive and negative voltage outputs is necessary and becomes expensive. Further, since the upper and lower electrodes are not at the grounded potential, there is a problem of a leak current to the substrate, an insulation protection to the upper electrode and the like are necessary, and a structure is complicated.

<Summary of Polarizing Directions and Drive Voltages>

FIG. 8 is a table showing the polarizing methods and the drive voltages in the first and second practical examples and the second comparative example. In FIG. 8, "displacement/voltage" is obtained by dividing the amount of the displacement by the absolute value of the drive voltage, and indicates the displacement efficiency per unit voltage. As is apparent from FIG. 8, it is known that the devices in the first and second practical examples can be driven more efficiently than the device in the second comparative example.

Moreover, the devices in the first and second practical examples can be driven by the driver which corresponds to the voltage output of any one polarity of the positive and the negative, and the devices in the first and second practical examples are less expensive than the device in the second comparative example. Further, in the devices in the first and second practical examples, since the upper and lower electrodes are at the grounded potential, it is possible to omit or simplify a countermeasure of the current leak to the substrate, the insulation protection with respect to the upper electrode, and the like.

<Example Applied to Liquid Ejection Head>

Figure 9:
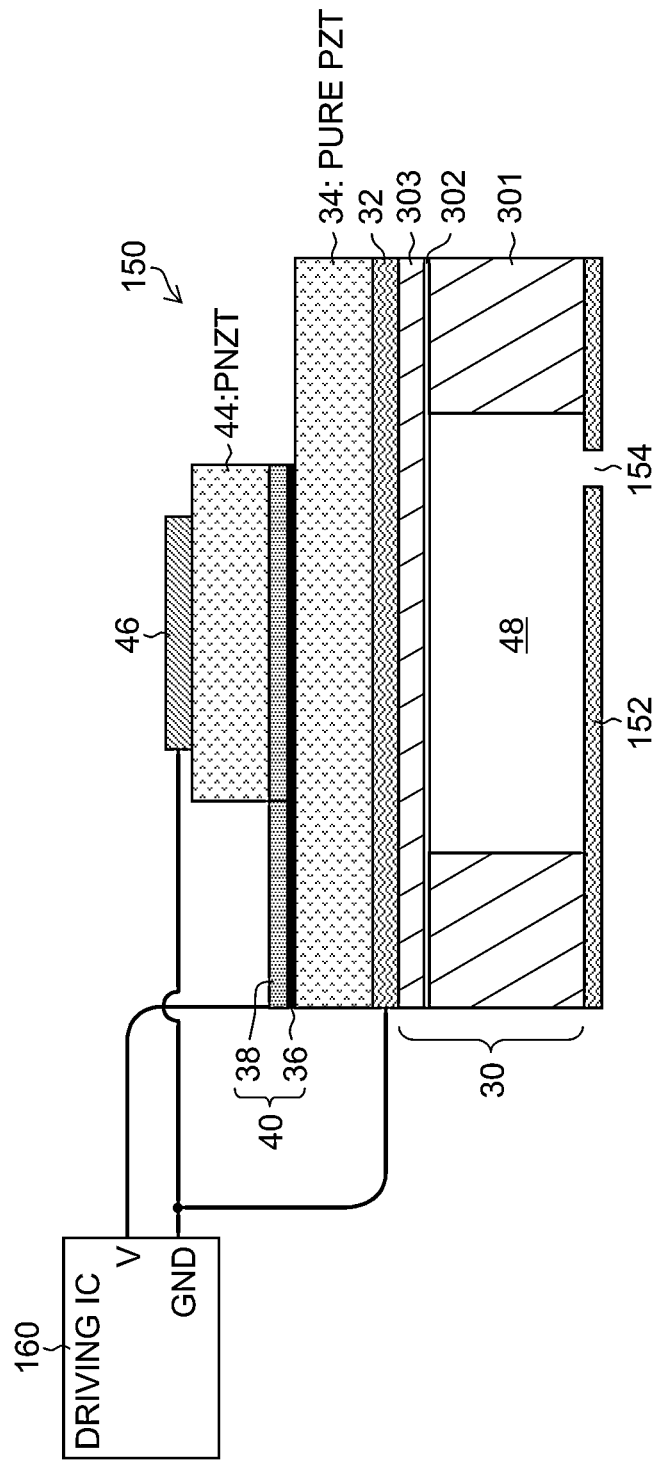
FIG. 9 is a cross sectional view showing a structure of an inkjet head according to an embodiment of the present invention.

FIG. 9 is a view showing a structure of an inkjet head according to an embodiment of the present invention. In FIG. 9, there is exemplified an inkjet head which employs the device structure described with reference to FIG. 5 in the first practical example as an ejection energy generating device; however, the device structure described with reference to FIG. 7 in the second practical example also can be employed.

In FIG. 9, the same or similar elements as those in the structure shown in FIG. 5 are denoted with the same reference numerals and a description thereof is omitted. An inkjet head 150 shown in FIG. 9 is structured such that a nozzle plate 152 is joined to a bottom surface of the Si layer 104 of the laminated structure described in FIG. 5. A nozzle aperture 154 functioning as an ejection port of an ink (a liquid) is formed in the nozzle plate 152. The ink is filled in the space (the pressure chamber) 48, the diaphragm (the Si layer 303) is deformed to deflect by means of the piezoelectric drive, and the volume of the pressure chamber 48 changes, whereby the pressure is changed and a droplet of the ink is ejected from the nozzle aperture 154. Thus, the laminated body described in FIG. 5 functions as an ejection energy generating device which generates an energy for ejecting the liquid from the nozzle, in the inkjet head 150 in FIG. 9.

Although not shown in FIG. 9, an ink supply flow path (a common supply path, an individual supply path, and the like) for supplying the ink to the pressure chamber 48 is formed in the Si layer 301. Further, in FIG. 9, there is shown the example in which the nozzle plate 152 is joined directly to the lower surface of the Si layer 301; however, a flow path plate in which the other flow path structure is formed can be arranged between the Si layer 301 and the nozzle plate 152.

FIG. 9 shows the element of the ejection mechanism which includes one nozzle aperture 154, the pressure chamber 48 connected to the one nozzle aperture 154, and the ejection energy generating device corresponding to the pressure chamber 48; however, the inkjet head 150 is provided with a plurality of ejection mechanisms (liquid droplet ejection devices) having the same structure.

The arranging of the nozzle apertures 154 in the ejection surface (the nozzle surface) of the nozzle plate 152 is not particularly limited. It is possible to employ various nozzle arrangements, for example, a one-dimensional arrangement in which the nozzles are arranged in one line, a staggered arrangement in which the nozzles are arranged in two lines, a two-dimensional arrangement in which three or more lines of nozzle lines are combined, and the like.

The lower electrode 32 and the upper electrode 46 are connected to a ground terminal of a drive circuit (a drive IC) 160, and are set to the grounded potential. The intermediate electrode 40 is connected to a drive voltage output terminal of the drive circuit 160, and functions as the drive electrode. The drive circuit 160 is for feeding the driving electric power (the drive voltage) configured to deform the piezoelectric films 34 and 44 between the electrodes.

According to this structure, it is possible to carry out the drive control only by the positive voltage as the drive signal. Accordingly, it is possible to simplify the drive circuit 160 in comparison with the second comparative example, and it is possible to realize the inkjet system which has a low cost and is high in durability and reliability.

In the inkjet head 150 in FIG. 9, if the device in the second practical example is applied in place of the device in the first practical example, it is possible to carry out the drive control only by the negative voltage as the drive signal.

<Operation>

As described above, in accordance with the embodiments of the present invention, since it is possible to use the piezoelectric films in the laminated structure, it is possible to achieve an effective performance improvement of the piezoelectric device using the piezoelectric film material.

For example, with regard to the piezoelectric device which is utilized as the piezoelectric actuator, a great displacement can be obtained by applying a drive voltage having a comparatively low voltage. Further, a burden of a control circuit including a drive circuit is lightened by a reduction of the drive voltage, and it is possible to achieve low cost, power saving, improvement of durability, and the like.

<Modified Example>

Although the diaphragm type piezoelectric actuators having the cavity structures have been described in the first and second practical examples, the applied range of the present invention is not limited to this, and the present invention can be applied to actuators of cantilever structures.

<Other Applied Example 1>

In the embodiments mentioned above, the description has been given by exemplifying the application to the inkjet head; however, the applied range of the present invention is not limited to this. For example, the present invention can be widely applied to a liquid ejection head which draws various shapes and patterns by using a liquid functional material, such as a wiring drawing apparatus, which draws a wiring pattern of an electronic circuit, a manufacturing apparatus of various devices, a resist printing apparatus using a resin liquid as a functional liquid for ejection, a color filter manufacturing apparatus, a micro structure forming apparatus, which forms a microstructure by using a material for a material deposition, and the like, and a liquid ejection apparatus (system) using the same.

<Other Applied Example 2>

In the embodiments mentioned above, the description has been given of the piezoelectric devices for the use of the actuators; however, the applied range of the present invention is not limited to this. The present invention can be applied to piezoelectric devices utilized for a variety of purposes such as sensors, power generation devices, and the like.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric device, comprising:
   a substrate;
   a first electrode which is layered over the substrate;
   a first piezoelectric film which is layered over the first electrode;
   a metal oxide film which is layered over the first piezoelectric film;
   a metal film which is layered over the metal oxide film;
   a second piezoelectric film which is layered over the metal film; and
   a second electrode which is layered over the second piezoelectric film,
   wherein a polarizing direction of the first piezoelectric film and a polarizing direction of the second piezoelectric film are different from each other.

2. A piezoelectric device, comprising:
a substrate;
a first electrode which is layered over the substrate;
a first piezoelectric film which is layered over the first electrode;
a metal oxide film which is layered over the first piezoelectric film;
a metal film which is layered over the metal oxide film;
a second piezoelectric film which is layered over the metal film; and
a second electrode which is layered over the second piezoelectric film,
wherein a polarizing direction of the first piezoelectric film and a polarizing direction of the second piezoelectric film are different from each other, wherein a product of a stress and a thickness is less than 100 N/m$^2$ in an intermediate layer constituted of the metal oxide film and the metal film between the first piezoelectric film and the second piezoelectric film.

3. The piezoelectric device as defined in claim 2, wherein the thickness of the intermediate layer is not smaller than 50 nm and smaller than 250 nm.

4. The piezoelectric device as defined in claim 1, wherein the metal oxide film includes an oxide of a metal of platinum group.

5. The piezoelectric device as defined in claim 1, wherein the metal film includes a metal of platinum group.

6. The piezoelectric device as defined in claim 1, wherein:
the first electrode and the second electrode are configured to be maintained in a grounded potential; and
an intermediate electrode including the metal film between the first piezoelectric film and the second piezoelectric film is configured to be used as a drive electrode to which a drive voltage for deforming the first piezoelectric film and the second piezoelectric film is applied.

7. The piezoelectric device as defined in claim 6, wherein when the drive voltage is applied to the intermediate electrode, each of the first piezoelectric film and the second piezoelectric film is applied with an electric field in a same direction as the polarizing direction thereof.

8. The piezoelectric device as defined in claim 1, wherein each of the first piezoelectric film and the second piezoelectric film is formed by means of a vapor phase epitaxy method.

9. The piezoelectric device as defined in claim 8, wherein the vapor phase epitaxy method is a sputtering method of crystallizing by implementing a heat film formation.

10. The piezoelectric device as defined in claim 1, wherein each of the first piezoelectric film and the second piezoelectric film is composed of a perovskite type oxide.

11. The piezoelectric device as defined in claim 1, wherein a composition of the first piezoelectric film and a composition of the second piezoelectric film are different from each other.

12. The piezoelectric device as defined in claim 1, wherein at least one of the first piezoelectric film and the second piezoelectric film is composed of one or more of perovskite type oxides expressed as:

$$A_a(Zr_x, Ti_y, M_{b-x-y})_b O_c, \qquad (PX)$$

where A is an A site element and at least one element including Pb; M is at least one element selected from a group consisting of V, Nb, Ta and Sb; O is oxygen, relationships $0 < x < b$, $0 \leq y < b$, and $0 \leq (b-x-y)$ are satisfied, and a standard mol ratio of the A site element, the B site element and oxygen is 1:1:3 but the mol ratio may deviate from the standard mol ratio within a range that enables a perovskite structure to be obtained.

13. The piezoelectric device as defined in claim 12, wherein:
one of the first piezoelectric film and the second piezoelectric film is composed of the one or more of perovskite type oxides expressed as PX; and
the other of the first piezoelectric film and the second piezoelectric film is composed of one or more of perovskite type oxides expressed as:

$$ABO_3, \qquad (P)$$

where A is the A site element and at least one element including Pb; B is a B site element and at least one element selected from a group consisting of Ti, Zr, V, Nb, Ta, Sb, Cr, Mo, W, Mn, Sc, Co, Cu, In, Sn, Ga, Zn, Cd, Fe and Ni, and a standard mol ratio of the A site element, the B site element and oxygen is 1:1:3 but the mol ratio may deviate from the standard mol ratio within a range that enables a perovskite structure to be obtained.

14. The piezoelectric device as defined in claim 1, wherein at least one of the first piezoelectric film and the second piezoelectric film is composed of lead zirconate titanate doped with niobium.

15. The piezoelectric device as defined in claim 1, wherein:
one of the first piezoelectric film and the second piezoelectric film is composed of lead zirconate titanate doped with niobium; and
the other of the first piezoelectric film and the second piezoelectric film is composed of a material not doped with niobium.

16. The piezoelectric device as defined in claim 15, wherein the polarizing direction of the one of the first piezoelectric film and the second piezoelectric film composed of lead zirconate titanate doped with niobium is a direction from the substrate toward the second electrode.

17. The piezoelectric device as defined in claim 15, wherein the material not doped with niobium is pure lead zirconate titanate.

18. The piezoelectric device as defined in claim 1, wherein the polarizing directions of the first and second piezoelectric films are parallel to thickness directions of the respective films and are reverse to each other.

19. A liquid ejection head, comprising:
a nozzle which is an ejection port configured to eject liquid;
a pressure chamber which contains the liquid and is connected to the nozzle; and
the piezoelectric device as defined in claim 1 which is arranged correspondingly to the pressure chamber and is configured to function as an ejection energy generating device to generate an energy to eject the liquid in the pressure chamber through the nozzle.

20. A manufacturing method of a piezoelectric device as defined in claim 1, the method comprising:
a first electrode formation step of layering a first electrode over a substrate;
a first piezoelectric film formation step of layering a first piezoelectric film over the first electrode;
a metal oxide film formation step of layering a metal oxide film over the first piezoelectric film;
a metal film formation step of layering a metal film over the metal oxide film;
a second piezoelectric film formation step of layering a second piezoelectric film over the metal film;
a second electrode formation step of layering a second electrode over the second piezoelectric film; and
a polarization process step of differentiating a polarizing direction of the first piezoelectric film and a polarizing direction of the second piezoelectric film from each other.

21. The method as defined claim 20, wherein each of the first piezoelectric film formation step and the second piezoelectric film formation step includes a vapor phase epitaxy method.

* * * * *